United States Patent [19]

Brault et al.

[11] Patent Number: 4,474,869

[45] Date of Patent: Oct. 2, 1984

[54] POLYVINYLPYRIDINE RADIATION RESISTS

[75] Inventors: Robert G. Brault, Santa Monica; Leroy J. Miller, Canoga Park, both of Calif.

[73] Assignee: Hughes Aircraft Company, El Segundo, Calif.

[21] Appl. No.: 417,979

[22] Filed: Sep. 14, 1982

Related U.S. Application Data

[62] Division of Ser. No. 268,429, May 29, 1981, abandoned.

[51] Int. Cl.$^3$ .............................................. C08F 26/06
[52] U.S. Cl. ................ 430/296; 204/159.14; 427/36; 427/44; 430/269; 430/281; 430/966; 526/265
[58] Field of Search ............... 427/36, 44; 526/265; 204/159.14; 430/269, 296, 966, 281

[56] References Cited

U.S. PATENT DOCUMENTS

| | | | |
|---|---|---|---|
| 2,448,542 | 9/1948 | McQueen et al. | 526/265 |
| 3,507,846 | 4/1970 | Haas | 526/265 |
| 3,743,608 | 7/1973 | Habu et al. | 430/527 |
| 3,817,752 | 6/1974 | Laridon et al. | 430/337 |
| 3,892,575 | 7/1975 | Watts et al. | 430/532 |
| 3,989,609 | 11/1976 | Brock | 427/36 |
| 4,224,359 | 9/1980 | Rembaum et al. | 427/44 |
| 4,348,472 | 9/1982 | Jagt | 430/296 |

OTHER PUBLICATIONS

Billmeyer, J. Pol. Sci., Part C, No. 8, pp. 161–176 (1965).

Primary Examiner—Harry Wong, Jr.
Attorney, Agent, or Firm—Gerald B. Rosenberg; David W. Collins; A. W. Karambelas

[57] ABSTRACT

Negative working resists, prepared from poly(vinylpyridine) polymers which exhibit good sensitivities to 20 keV electron beam radiation, are disclosed. The poly-(vinylpyridine) polymers of this invention may contain alkyl substituents on the pyridine rings in ortho, meta or para positions with respect to the nitrogen atom within said ring.

12 Claims, No Drawings

POLYVINYLPYRIDINE RADIATION RESISTS

This is a division of application Ser. No. 268,429, filed May 29, 1981, now abandoned.

TECHNICAL FIELD

This invention relates, generally, to radiation sensitive polymers used as a resist for electron beam lithography and, more particularly, to the preparation of resist from poly(vinylpyridine).

BACKGROUND OF THE INVENTION

1. Field of the Invention

This invention provides a new negative resist for use in the preparation of microelectronics using electron beams and other forms of irradiation.

2. Description of the Prior Art

The use of radiation sensitive polymers as resists in the fabrication of certain microelectronic devices and circuits has been known for some time. An excellent review of certain requirements of the state of this art is contained in an article by Murrae J. Bowden entitled "Electron Irradiation of Polymers and Its Application to Resist for Electron-Beam Lithography" published in CRC *Critical Reviews Solid State Sciences* at pp. 223 et. seq. in February of 1979.

Materials known to function as resist in the prior art include, but are not limited to, polymers bearing epoxide groups, such as poly(glycidyl methacrylate), glycidyl methacrylate copolymers, and epoxidized polybutadiene; polymers bearing olefinic groups, such as poly(diallyl phthalate), allyl esters of vinyl ethermaleic anhydride copolymers, polybutadiene, and various olefinic photoresists; and less sensitive materials such as polymethylsiloxane, polystyrenes, poly(vinyl chloride), poly(vinyl acetate), poly (methyl vinyl ketone), and poly(vinylferrocene).

Negative resists were disclosed by Saburo Imamura in an article entitled "Chloromethylated Polystyrene as a Dry Etching Resistant Negative Resist for Sub Micron Technology" that was published in the *Journal of the Electrochemical Society: SOLID STATE SCIENCE AND TECHNOLOGY*, 1979.

Other relevant prior art, to the invention described below, is disclosed in an article entitled "Experimental Observations of Nearly Monodisperse Polystyrene as Negative Electron Resist" by Joey H. Lai et al, *Journal of the Electrochemical Society: SOLID STATE SCIENCE AND TECHNOLOGY*, Vol. 126, No. 4, page 696 in April of 1979. Still other equally relevant prior art is embodied in an article entitled "Polymeric Electron Beam Resist" by H. Y. Ku et al published in *Journal of the Electrochemical, Society: SOLID STATE SCIENCE* in July of 1969, at page 980 et. seq. And, the article entitled "Contrast in the Electron Beam Lithography of Substituted Aromatic Homopolymers and Copolymers" by E. D. Feit et al was published Nov/Dec 1979 in the *Journal Vacuum Science Technology* similarly describes polystyrene resists which are structurally very similar to the resist of the present invention.

However, it is apparent from the above-mentioned articles that a negative working resist prepared with polystyrene is relatively insensitive and is therefore often unsuitable for practical applications in the design and fabrication of certain types of microelectronic circuits.

While the above-mentioned prior resists have met with a measure of success, there is still a need for negative working electron beam resists having higher sensitivities than those of the above prior art and which are susceptible of being developed into fine line images after exposure to incident forming radiation. It is the fulfillment of this need to which the present invention is directed.

SUMMARY OF THE INVENTION

The general purpose of this invention is to provide an improved negative working radiation resist material, having sensitivities to 20 keV electrons of from 1 to $5 \times 10^{-6}$ coloumbs per square centimeter ($C/cm^2$) and which, when developed, yields image resolutions in the range of 0.5 to 2.0 micrometers ($\mu m$). This material finds substantial utility in the fabrication of certain microelectronic devices and circuits.

In achieving this purpose, we have discovered a new class of negative working radiation resist materials consisting of poly(vinylpyridines) and substituted poly(vinylpyridines). Such materials are initially used, for example, in recording an image pattern defined by a computer-controlled electron beam, and, after suitable development of the resist, for then transferring the pattern into an underlying substrate by wet etching, plasma etching, ion milling or other suitable processes. Negative working resist materials of this invention can also be used to record images formed with other types of radiations, such as X-rays or ion beams.

It is, therefore, one purpose of this invention to provide an improved negative working resist material which has a sensitivity of less than $5 \times 10^{-6} C/cm^2$ to 20 keV electrons when exposed as a coating approximately 0.5 $\mu m$ thick.

An additional purpose of this invention is to provide negative working radiation resist materials of the type described that are satisfactory for use in providing the high resolution patterning of masks with 20 keV electrons.

A further purpose of this invention is to provide negative working radiation resist materials that are suitable for use with other types of radiation such as X-rays and ion beams.

A still further, and very important, purpose of this invention is to provide negative working radiation resist materials which are capable of development to produce images whose resolutions are typically in the range of from 0.5 to 2.0 micrometers ($\mu m$).

That we have achieved the above-stated purposes and accomplished other objectives will become clear upon reference to the following detailed description of the invention.

DETAILED DESCRIPTION OF THE INVENTION

In seeking to provide a new class of negative working radiation resist materials, which exhibit none of the disadvantages of prior art resist materials while retaining most, if not all, of the advantages of said materials and at the same time providing improved characteristics over prior art materials, we have developed a new class of materials consisting of poly(vinylpyridines) and alkyl substituted poly(vinylpyridines) whose general structures are:

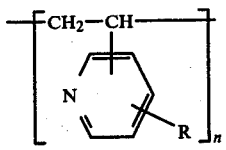

where R is hydrogen or an alkyl group, such as methyl, ethyl, propyl, butyl, pentyl, benzyl, or the like. The alkyl group may consist of from 1 to 10 carbon atoms and may be attached to any of the carbons in the pyridine ring other than that which is attached to the polymer chain.

The resists, of this invention, may also be copolymers consisting of any of the above-indicated unit structures combined in any order or in any proportion. They may also be copolymers of vinylpyridines and/or alkyl vinylpyridines with other monomers, providing these copolymers contain substantial amounts of vinylpyridine repeating units. For example, this invention includes copolymers of vinylpyridines with styrene or substituted styrenes, in which the majority of the repeating units are of the vinylpyridine type.

The synthesis of these materials can be accomplished by polymerizations of the appropriate vinylpyridine monomers by the various methods that are well-known to those skilled in polymer science. These methods include the various techniques of free-radical polymerization. Vinylpyridine monomers are commercially available from several chemical supply companies. Regardless of the method by which these materials are made, the sensitivity to radiation will be dependent upon the molecular weight of the polymer. As the average molecular weight is increased, the sensitivity will increase. The sensitivity will also be affected by the dispersivity, which is the weight average molecular weight ($M_w$) divided by the number average molecular weight ($M_n$). As the dispersivity decreases, the sensitivity will increase slightly. For polymers with a given repeat unit, the product of $M_w$ and the minimum required radiation dose (Q) is approximately a constant, if the dispersivity is approximately constant. Therefore, it is desirable to use polymers with as high a $M_w$ as possible, if good coatings can be prepared, and with $M_w/M_n$ as small as possible. We prefer to use resists with $M_w$ in the range of 5 to $300 \times 10^4$ (i.e., n ranges from about 500 to 30,000).

The resist is coated onto the desired substrate by any of the well-known coating techniques using a solution of the resist in an appropriate solvent. Useful solvents include, but are not limited to, 2-methoxyethanol, 2-ethoxyethanol, linear and branched alcohols having six or less carbons, dimethylformamide, dimethylacetamide, methylformamide, methylacetamide, N-methylpyrrolidinone, pyridine and other similar solvents, or mixtures which include one or more of the above solvents.

A substrate can be readily coated by covering it with an excess of a resist solution and spinning it at a high speed (e.g., 500–10,000 rpm) to remove the excess and leave a thin coating of resist, which dries upon spinning. Usually, these coatings are used when they are 0.1 to 5 $\mu$m thick. Also, they are generally baked to remove any residual solvent and to improve the adhesion of the coating to the substrate. We prefer to bake these resists at temperatures ranging from 50° to 110° C. for 0.5 to 24 hours, usually in vacuum or nitrogen, although other baking conditions are also acceptable, so long as temperatures above which decomposition occurs are avoided.

The resist can be exposed with electron beams, ion beams or x-rays, although the sensitivity will vary with the type and the energy of the radiation used. The radiation pattern can be produced by using a focused, directed beam or by passing the radiation (preferably collimated radiation) through a suitable mask. The minimum radiation dose is that which causes the resist to crosslink and become insoluble in solvents that dissolve the unexposed resist. Generally, however, we prefer to use a dose that causes sufficient crosslinking to leave an insoluble polymer coating that is at least half as thick as the original resist coating after development with a suitable solvent. This dose is called $Q_{0.5}$.

Solvents useful in developing the image in the resist are the same as those useful in forming a solution for coating the resist on the substrate. The development may be achieved by dipping or spraying the irradiated resist with the solvent. Generally, development is carried out over a period of 5 sec. to 10 min. This leaves a pattern of crosslinked polymer in the areas that received sufficient radiation to induce crosslinking. A drying step is recommended to remove residual developer solvent and to harden the crosslinked resist.

The resist pattern is then ready for use in preparing a pattern in the substrate itself. This may be achieved by wet-etching or plasma-etching the exposed substrate, while the unexposed substrate is protected by the resist. It may also be accomplished by bombarding the surface with ions, which may either remove part of the substrate or induce changes within the substrate. The method of transferring the resist pattern into the substrate is not material to this invention.

The following examples are given to illustrate the practice of this invention.

EXAMPLE I

A coating solution was prepared by dissolving 1 gram poly(4-vinylpyridine) (Polysciences Inc. of Warrington, PA) in 25 ml n-butyl alcohol. This solution was filtered through a 3 $\mu$m Sartorius Membranfilter and used to spin-coat a silicon wafer with spinning at 1500 rpm. After the wafer was baked at 90° C. for 1 hour in a vacuum, the coating thickness was found to be 5600 Å by measurement with a Sloan Dektak surface profile measuring system.

The coated wafer was given a patternwise exposure to 20 keV electrons. The pattern consisted of some lines plus a matrix of 100 squares, each 25 $\mu$m on a side. The dwell time was varied in a linear fashion along one axis of the matrix, while the point spacing varied linearly along the other axis. This matrix was written two times with beam currents of $3 \times 10^{-11}$ and $3 \times 10^{-12}$ amperes.

The image was developed by dipping the irradiated substrate in a 1:1 mixture of isopropyl alcohol and dioxane for a period of 30 sec, with agitation of the solvent to facilitate removal of the unexposed resist. A pattern of lines and squares was left on the wafer, with the thickness of the remaining resist being related to the exposure received.

An Nanospec AFT Microarea Film Thickness Gauge was used to measure the thickness of the resist in the various squares. The normalized thickness was plotted against the log of the exposure received in $C/cm^2$. The exposure required to give a normalized thickness of 0.5 ($Q_{0.5}$) was $6.33 \times 10^{-7} C/cm^2$, which is the sensitivity of the resist. The slope (γ) of the approximately linear descending portion of this curve was 0.72, which is the contrast of the resist.

EXAMPLE II

A solution of 1 gram poly(2-vinylpyridine) (Polysciences Inc.) in 15 ml of 2-methoxyethanol was filtered through a 1 μm Teflon Millipore filter and coated onto a silicon wafer with spinning at 2000 rpm. After baking at 50° C. for four hours in a vacuum, the thickness was measured as 4400 Å with the Dektak and 4890 Å with the Nanospec AFT Microarea Film Thickness Gauge. The wafer was exposed to the matrix pattern, described in Example 1, at $3 \times 10^{-11}$ amperes, and the pattern was developed in dimethylformamide for 15 seconds, then baked at 50° C. for 1 hour in a vacuum. The thickness of appropriate squares was measured with the Nanospec AFT, and the normalized thickness was plotted against the log of the dose. The exposure required to give normalized thickness of 0.5 ($Q_{0.5}$) was $5.7 \times 10^{-6}$ C/cm$^2$, and the contrast was 1.20.

EXAMPLE III

A solution of 3 grams poly(4-vinylpyridine) (synthesized at HRL) in 50 ml 2-methoxyethanol was filtered through a 0.45 μm Sartorious membranfilter and coated onto a silicon wafer with a spin speed of 2000 rpm. After baking at 50° C. one hour in a vacuum, the thickness was measured as 4380 Å when measured with the Dektak. The wafer was exposed to 2 sets of a matrix pattern with 20 keV electrons as described in Example I. The wafer was cleaved, separating the exposed patterns, and one pattern was developed in a mixture of one part dioxane and one part isopropyl alcohol for thirty seconds. After blowing dry with nitrogen and baking at 50° C. in vacuo for one hour, the thickness of appropriate squares was measured on the Nanospec AFT. The exposure required for a normalalized thickness of 0.5 ($Q_{0.5}$) was $4.8 \times 10^{-6}$ C/cm$^2$ and the contrast was 2.63. The second half of the wafer was developed in 2-ethoxyethanol and after similar baking and measurement, the $Q_{0.5}$ was determined to be $5.3 \times 10^{-6}$ C/cm$^2$ and the contrast 2.36.

EXAMPLE IV

A solution of 1.18 grams poly(2-methyl-5-vinyl pyridine) (Polysciences Inc.) in 20 cc 2-ethoxyethanol and filtered through a 0.45 μm membrane filter was coated on a silicon wafer at 100 rpm. After baking for six hours at 50° C. in a vacuum, the thickness was measured on the Dektak to be 5318 Å. The wafer was exposed with 20 keV electrons to a matrix pattern as described in Example I. The exposed wafer was developed in 2-(2-ethoxyethoxy) ethanol. After baking at 50° C. for one hour in a vacuum, the thickness of appropriate squares was measured on the Nanospec AFT. The exposure required for a normalized thickness of 0.5 was $1.36 \times 10^{-6}$ C/cm$^2$ and the contrast was 1.43.

INDUSTRIAL APPLICABILITY

The use of resists susceptible to electron beam radiation has application in the preparation of miniature circuits for diverse microelectronic devices.

As final resolutions and increased sensitivities are obtained, microelectronic devices having circuit patterns of decreased size, will be available. This facilitates the preparation of the devices with greater storage capacities in less bulk than heretofore possible.

The decreased dimensions of the features on the microelectronics devices results in the preparation of circuits having a lower capacitance, and the diminished capacitance permits the circuits to function with increased speed.

Having completely described our invention and provided teachings which enable others to make and use the same, the scope of our claims may now be understood as follows.

What is claimed is:

1. A method for forming a pattern for use in the fabrication of microelectronic circuits, in which a negative resist material is employed for recording image patterns therein, said method including the steps of:
   (a) contacting a substrate with a solution comprising a solvent and a polymer suitable as a negative resist material;
   (b) removing said solvent to thereby deposit said polymer on said substrate; and
   (c) irradiating said polymer with a beam of electrons, ions, or x-rays for a time sufficient to cause cross-linking of said resist and render said cross-linked resist insoluble in solvents that dissolve unexposed resist,
   characterized in that the majority of the repeating units of said polymer have the structure

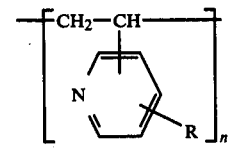

where
R is hydrogen or an alkyl group having from 1 to about 10 carbon atoms, where n may range from 500 to 30,000 and where attachments to the pyridine ring are to the 2, 3, 4, 5 or 6 positions.

2. The method of claim 1 wherein R is H.
3. The method of claim 1 wherein R is CH$_3$.
4. The method of claim 1 wherein said polymer comprises poly(2-vinylpyridine).
5. The method of claim 1 wherein said polymer comprises poly(2-methyl-5-vinylpyridine).
6. The method of claim 1 wherein said polymer comprises poly(4-vinylpyridine).
7. A method for forming a pattern for use in the fabrication of microelectronic circuits, in which a negative resist material is employed for recording image patterns therein, said method including the steps of:
   (a) contacting a substrate with a solution comprising a solvent and a polymer suitable as a negative resist material;
   (b) removing said solvent to thereby deposit said polymer on said substrate; and
   (c) irradiating said polymer with a beam of electrons, ions, or x-rays in a predetermined pattern for a time sufficient to cause cross-linking of said resist in said predetermined pattern and render said cross-linked resist insoluble in solvents that dissolve unexposed resist,
   characterized in that the majority of the repeating units of said polymer have the structure

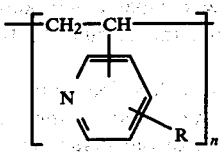

where
R is hydrogen or an alkyl group having from 1 to about 10 carbon atoms, where n may range from 500 to 30,000 and where attachments to the pyridine ring are to the 2, 3, 4, 5 or 6 positions; and
(d) developing said pattern formed by said irradiation within said resist into images.

8. The method of claim 7 wherein R is H.

9. The method of claim 7 wherein R is $CH_3$.

10. The method of claim 7 wherein said polymer comprises poly (2-vinylpyridine).

11. The method of claim 7 wherein said polymer comprises poly(2-methyl-5-vinylpyridine).

12. The method of claim 7 wherein said polymer comprises poly(4-vinylpyridine).

* * * * *